United States Patent
Cheng et al.

(10) Patent No.: US 6,781,392 B1
(45) Date of Patent: Aug. 24, 2004

(54) MODULARIZED PROBE CARD WITH COMPRESSIBLE ELECTRICAL CONNECTION DEVICE

(75) Inventors: Shih-Jye Cheng, Hsinchu (TW); An-Hong Liu, Tainan (TW); Yeong-Her Wang, Tainan (TW); Yuan-Ping Tseng, Hsinchu (TW); Yao-Jung Lee, Tainan (TW)

(73) Assignees: Chipmos Technologies Ltd., Hamilton (BM); Chipmos Technologies Inc., Hsinchu (TW)

( * ) Notice: Subject to any disclaimer, the term of this patent is extended or adjusted under 35 U.S.C. 154(b) by 33 days.

(21) Appl. No.: 10/435,560

(22) Filed: May 12, 2003

(51) Int. Cl.[7] ............................................... G01R 31/02
(52) U.S. Cl. ...................... 324/754; 324/762; 324/158.1
(58) Field of Search ................................ 324/754, 762, 324/757, 758, 158.1, 765, 761; 439/682, 66, 70; 29/840, 842; 438/14, 17, 18, 19; 257/696, 40, 48; 174/254; 361/749, 750, 751

(56) References Cited

U.S. PATENT DOCUMENTS 5,090,118 A * 2/1992 Kwon et al. .................. 29/843
5,850,148 A * 12/1998 Nam ........................... 324/761
5,917,330 A * 6/1999 Miley .......................... 324/762
6,060,891 A    5/2000 Hembree et al.
6,388,456 B1 * 5/2002 Kojima ........................ 324/754
6,476,626 B2 * 11/2002 Aldaz et al. ................. 324/757

* cited by examiner

Primary Examiner—Kamand Cuneo
Assistant Examiner—Jimmy Nguyen
(74) Attorney, Agent, or Firm—Dennison, Schultz & Dougherty

(57) ABSTRACT

A modularized probe card comprising an interface board, a probe head and at least a compressible electrical connection device is disclosed. The compressible electrical connection device comprises an insulation layer with a plurality of circuits on one of its surface. Two ends of each circuit connect respectively to the first contacting pad and the second contacting pad which combine with elastic contact members. Each elastic contact member has a supporter combining with a conductive layer for electrical connections by pushing and compressing. While a probe head is modularized installed on an interface board, the elastic contact members of the compressible electrical connection device is elastically contacted and compressed the probe head and the interface board to acquire modularized electrical connection of the probe card.

18 Claims, 6 Drawing Sheets

MODULARIZED PROBE CARD WITH COMPRESSIBLE ELECTRICAL CONNECTION DEVICE

FIELD OF THE INVENTION

The present invention relates to a probe card for establishing electrical contact with semiconductor wafers under test and, more particularly, to a modularized probe card with compressible electrical connection devices.

BACKGROUND OF THE INVENTION

During a semiconductor fabrication process, semiconductor dices are formed on a wafer by photolithography, deposition, and etching. The wafer is a substrate formed of silicon or gallium arsenide. After the fabrication process and before it is singulated, the wafer will need to pass functional test to verify their electrical performance within design specification. Conventionally, a test head of a test apparatus for chip probing usually mounts a probe card with a plurality of probe needles or other contact members for contacting with electrodes, such as bond pads or bumps, of a wafer. The probe card provides electrical connections between the test apparatus and the wafer under test.

In U.S. Pat. No. 6,060,891 entitled "PROBE CARD FOR SEMICONDUCTOR WAFER AND METHOD AND SYSTEM FOR TESTING WAFERS", a probe card with a silicon interconnect substrate is disclosed. Some contact elements shaping like bumps are formed on a bottom surface of the interconnect substrate. The interconnect substrate is electrically connected to a membrane, which is electrically connected to the interconnect substrate and a probe card fixture. A force-applying mechanism is installed above top surface of the interconnect substrate to press the interconnect substrate for establishing electrical communication between contact elements and electrodes on a wafer under test. Since the thermal expansion coefficient of the interconnect substrate and that of the wafer under test are the same, precise contact is provided and no skew will occur by temperature variation between the electrical contacts. Yet one disadvantage is that the membrane fixes and joints the interconnect substrate with probe card fixture and makes it impossible to disassemble the interconnect substrate. It will need to discard the probe card once damage or mistake occurs on the interconnect substrate, and this will make it impossible to effectively reduce the testing cost

SUMMARY OF THE INVENTION

A main purpose of the present invention is to supply a modularized probe card with compressible electrical connection device. It utilizes elastic contact members to elastically and electrically contact with a probe head and an interface board. The probe head is modularized installed in and electrically connected to the interface board. The modularization of probe head and interface board makes it possible to reduce cost in manufacturing probe cards.

The probe card in accordance with present invention comprises an interface board, a modularized probe head and at least a compressible electrical connection device. The interface board has a downset for installing the probe head. The compressible electrical connection device has an insulation layer with a plurality of circuits. Two ends of each circuit connect respectively to the first and the second contacting pads which combines with a plurality of elastic contact members. Each elastic contact member has a supporter, combining with a conductive layer, for electrically connecting the interface board with the probe head.

DETAIL DESCRIPTION OF THE INVENTION

Please refer to the drawings attached, present invention will be described by means of an embodiment below.

Figure 1:
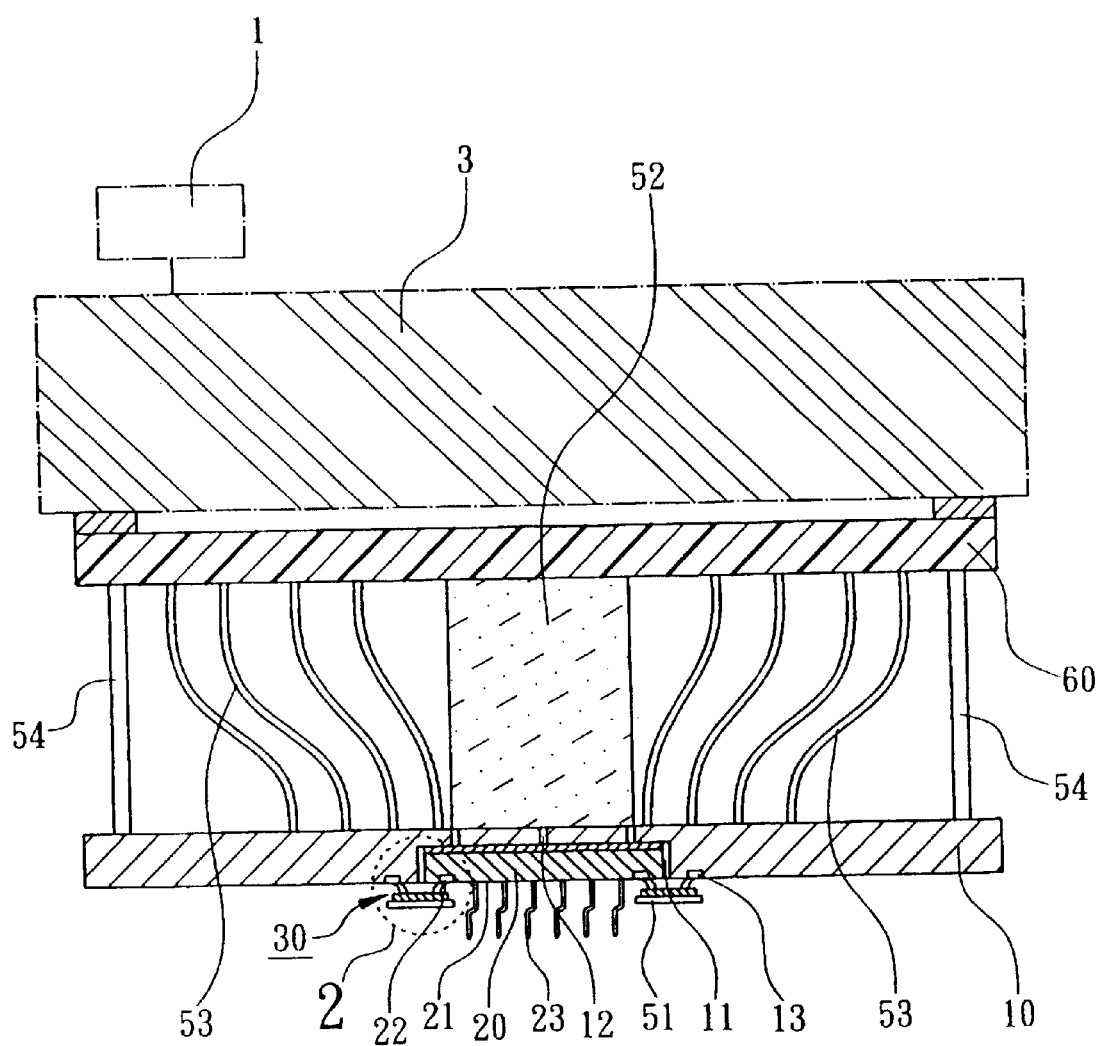
FIG. 1 is a cross-sectional view of a probe card in accordance with the first embodiment of the present invention.

As shown in FIG. 1, the first embodiment in accordance with present invention comprises a modularized probe card. It mainly comprises an interface board 10, a probe head 20, at least a compressible electrical connection device 30, and a mounting board 60. The mounting board 60 is for installing the probe card on a test head 3 of a test apparatus 1. The mounting board 60 utilizes a supporting bar 54 and a plurality of coaxial cables to electrically connect with the interface board 10. The interface board 10 is a multi-layer printed circuit board having a downset 11 surrounding by several connecting ends 13. The connecting end 13 provides electrical connections to probe head 20 while the probe card is installed on the test head 3 of the test apparatus 1. It is preferable that the interface board 10 has a plurality of through holes 12 passing through a top surface and a bottom surface of the interface board 10. The through holes 12 connect to the downset 11 so as to fix the probe head 20 onto the downset 11 of the interface board 10 by a vacuum pump 52.

The probe head 20 is modularized installed in downset 11 of the interface board 10. Probe head 20 has a probing surface 21 forming with a plurality of probe needles 23 and contact pads 22 surrounding on its periphery. Probe head 20 is manufactured by means of semiconductor fabrication technique such as photolithography, deposition and etching to form traces (not shown in figure) and contact pads 22, and then micro-electro-mechanical-system (MEMS) fabrication processes are used to fabricate all sorts of probe needles 23, such as vertical probe needles, curved probe needles, conductive pillars or bumps. It is preferable that the probe head 20 comprises a chip with micro-mechanical-system element, including such as probe needles 23, micro sensors or micro actuators. It is preferable that a cushioning layer 24 is formed on the other surface of probe head 20 to avoid micro-cracking or even breaking by inappropriate stress. Preferably, the installation of downset 11 of the interface board 10 should cause the contact surface 21 of probe head 20 to be horizontal to the bottom surface of the interface board 10.

Figure 2:
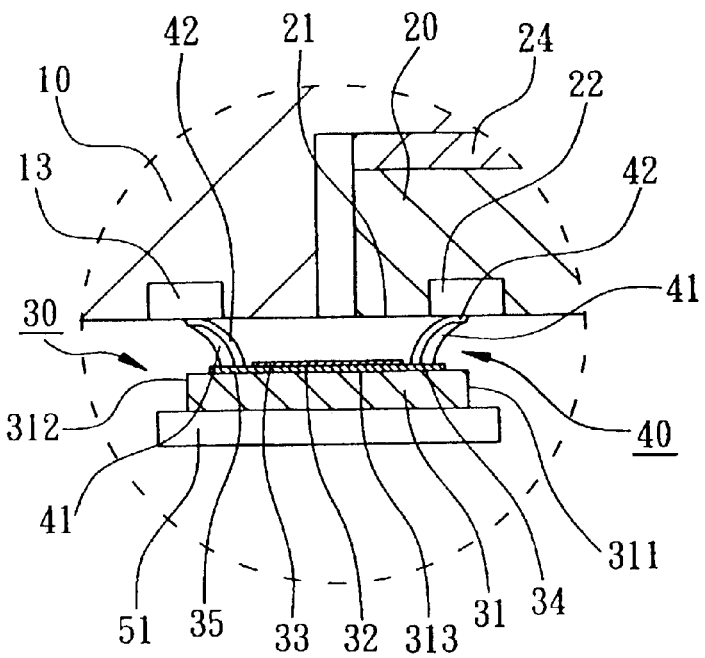
FIG. 2 is a cross-sectional view of a portion of a probe head of the probe card in accordance with the first embodiment of the present invention.
Figure 3:
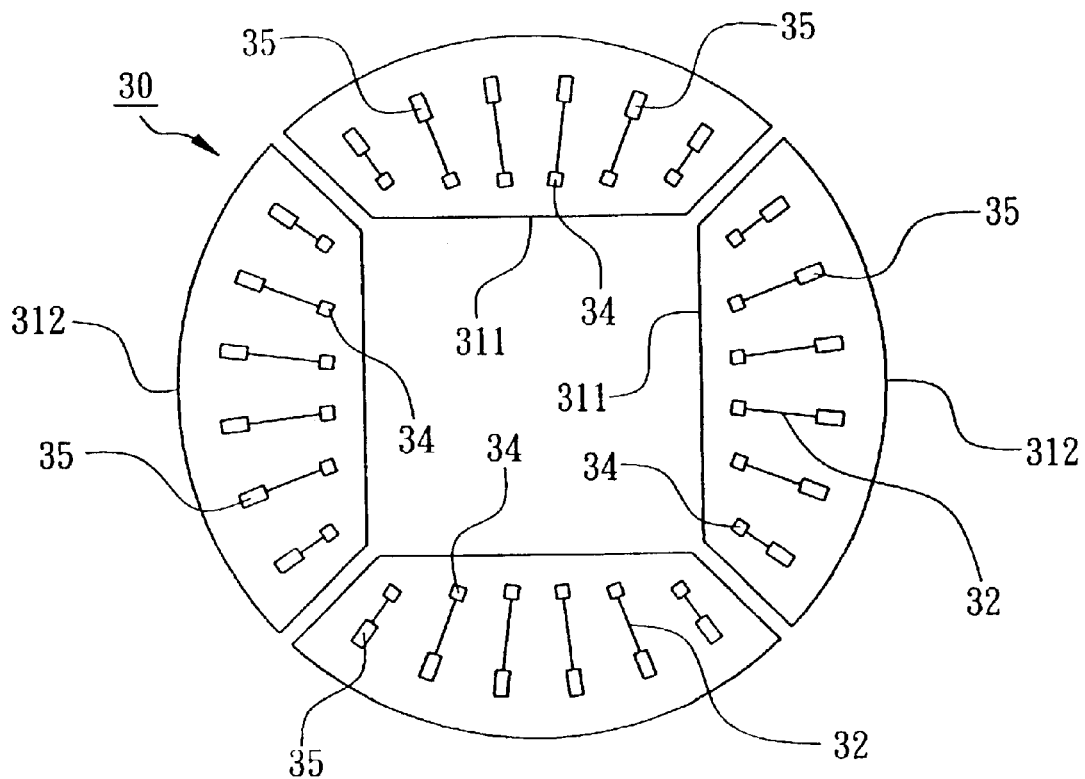
FIG. 3 is a top view of a plurality of electrical connection devices of the probe card in accordance with the first embodiment of the present invention.

The compressible electrical connection device 30 is elastically and electrically contacted with the probe head 20 and interface board 10, as shown in FIG. 2 and 3. The compressible electrical connection device 20 is for internally electrical contacting with the probe head 20 and the interface board 10. The compressible electrical connection device 30 comprises an insulation layer 31, shaping as a sector and having a surface 313, an outer end 312, and an inner end 311. A plurality of compressible electrical connection devices 30 are arranged as a circle. It is that the insulation layer 31 is formed of flexible insulating materials such as polylimide, polyester or glass fiber reinforced resin. On the surface 313 of the insulation layer 31, a plurality of circuits 32 are formed and two ends of each circuit 32 connect respectively to a first contacting pad 34 and a second contacting pad 35. The first contacting pads 34 are closer to the inner end 311 and corresponding in location to the contact pads 22 of the probe head 20. The second contacting pads 35 are closer to the outer end 312. It is preferable that a cover layer 33 is formed on the surface 313 of the insulation layer 31, to cover and protect the circuits 32. Each of the first contacting pads 34 and second contacting pads 35 connects to an elastic contact member 40 respectively. Every elastic contact member 40 has a curved supporter 41 and a conductive layer 42. The curved supporter 41 can be thick photoresist, manufactured by the MICRO CHEM with series No. SU-8 2000, or other elastic insulation materials, such as polyimide or BCB (benezo cyclobutene) or Silicon gel. In this embodiment, the curved supporter 41 has an arched surface for connecting with the conductive layer 42. The conductive layer 42 is electrically connected corresponding in location to the first contacting pad 34 or the second contacting pad 35. The conductive layer 42 is made of tungsten, aluminum, gold, copper, palladium, titanium, platinum, nickel or compound metal from the above, which is metal of non-reflow, for electrical connection in touching and pressing.

Because the contact members 40 are elastical in electrical contact, the compressible electrical connection device 30 can be modularized contacted with the probe head 20 and the interface board 10. The following is an example. A fixture 51 fixes the electrical connection device 30 onto the periphery of downset 11 of the interface board 10. The first contacting pads 34 of the compressible electrical connection device 30 are electrically connected via the elastic contact members 40 corresponding in location, to the contact pads 22 of the probe head 20. The second contacting pads 35 of the compressible electrical connection device 30 are electrically connected via the elastic contact members 40 corresponding in location, to the connecting ends 13 of the interface board 10. It is therefore that the probe head 20, relative to the probe card, is replaceable. It is not necessary to discard the entire probe card while the probe head 20 or the interface board 10 is damaged. In another application, when the distribution of electrodes of wafer under test changes, especially for wafers with redistribution bumps and bare wafer, it only needs to redesign a probe head 20 and modularly combining with a same interface board 10 for application. In still another application, when a wafer with same distribution of electrodes needs to be tested among different test apparatuses, it only needs to manufacture the appropriate interface board 10 and modularly combining with probe head 20, and then it is applicable to another type of test apparatus. With this characteristic, it is possible to effectively reduce testing cost during the wafer testing process.

Figure 4A:
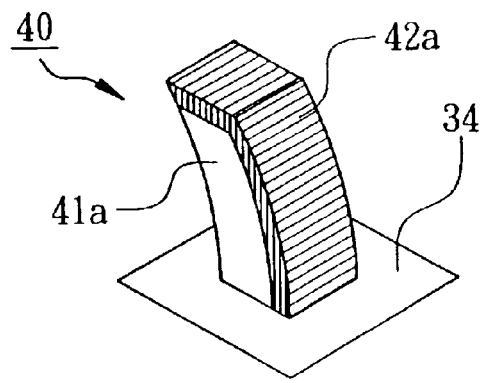
FIGS. 4A to 4F are three-dimensional views of each electrical connection device combining with different elastic contact member in accordance with the first embodiment of the present invention.
Figure 4B:
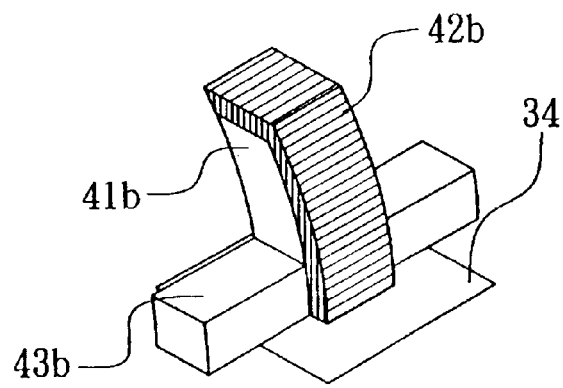
Figure 4C:
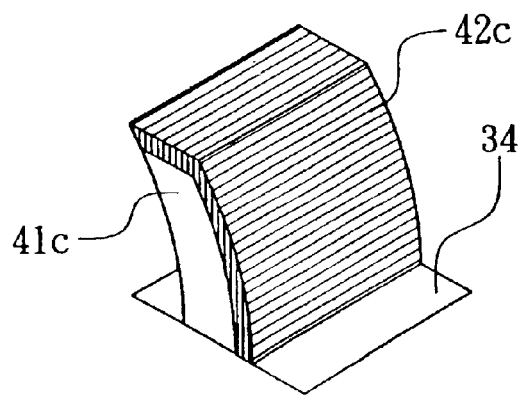
Figure 4D:
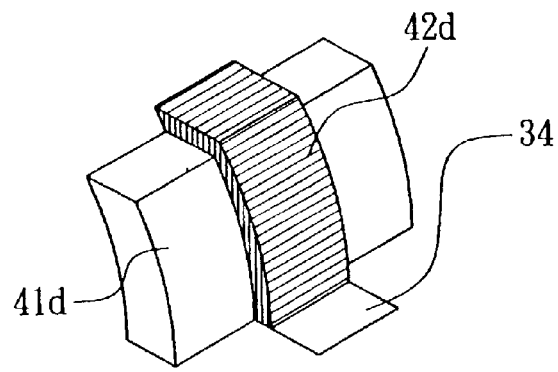
Figure 4E:
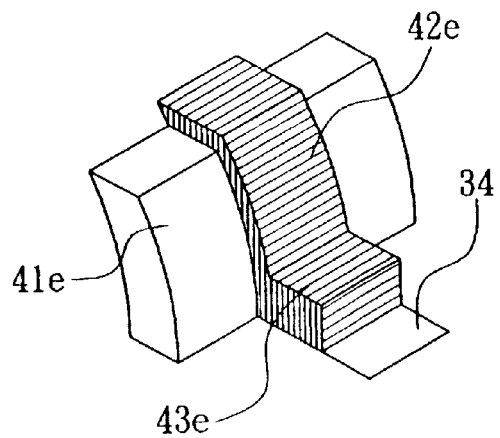
Figure 4F:
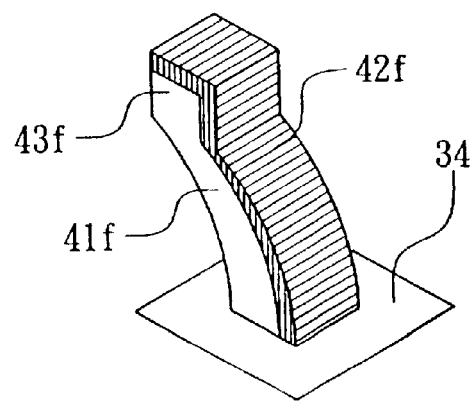

In addition, the elastic contact member 40, with which the compressible electrical connection device 30 according to present invention is combined, has multiple formats. As shown in FIG. 4A, one end of each supporter 41a of the elastic contact member 40 combines with the corresponding first contacting pad 34 or the second contacting pad 35, and one end of each conductive layer 42a on the supporter 41a also extend to combine with the corresponding first contacting pad 34 or the second contacting pad 35. Furthermore, as shown in FIG. 4B, a combining end of supporter 41b of the elastic contact member 40 has a base 43b, with its two ends extending through the exterior of corresponding combining first contacting pad 34 until coating on the surface 313 of the insulation layer 31 to strengthen the reliability of the supporter 41b. The supporter 41b also combines with a conductive layer 42b. Furthermore, as shown, in FIG. 4C, two laterals of supporter 41c of the elastic contact member 40 are cut equally to combine with the corresponding first contacting pad 34 to provide a larger combining surface of conductive layer 42c. Furthermore, as shown in FIG. 4D, two ends of supporter 41d of the contact member 40 extend through the exterior of corresponding combining first contacting pad 34, and a conductive layer 42d partially combines with one surface of the supporter 41d. Still furthermore, as shown in FIG. 4E, one end of supporter 41e of the contact member 40 combines with the exterior of the corresponding combining first contacting pad 34, and has two bottom wings extending through the first contacting pad 34. A conductive layer 42e, combining with the supporter 41e, has a horizontal extension portion 43e for electrically combining with the corresponding first contacting pad 34. Still furthermore, as shown in FIG. 4F, a supporter 41f of contact member 40 has a vertical probe portion 43f, which is vertical to the corresponding combining first contacting pad 34, to acquire a better electrical contact for a conductive layer 42f. The all sorts of elastic contact members described above all have the effect to function the compressible electrical connection device 30 of probe card according to the present invention with modularized elasticity. In addition, the compressible electrical connection device 30 of the probe card according to the present invention also can be formed with fabrications of multi-layer circuits.

Figure 5:
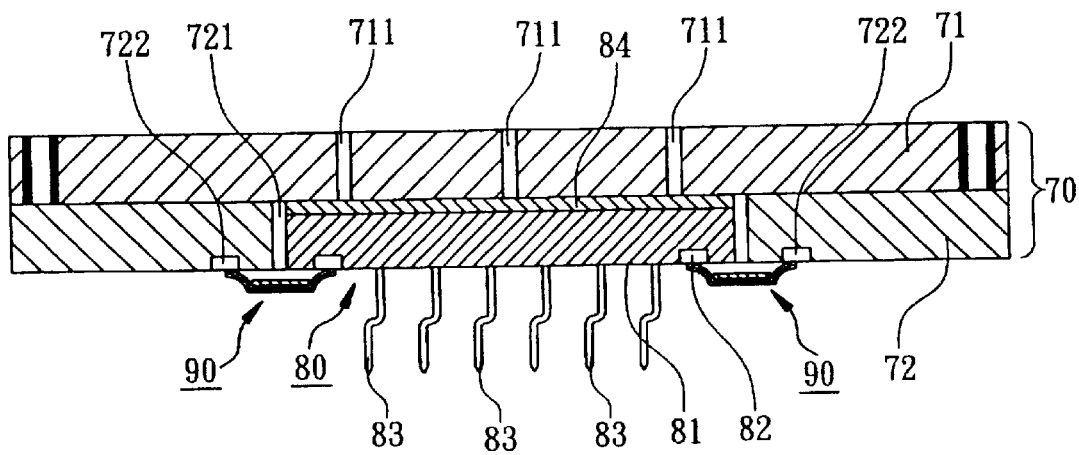
FIG. 5 is a cross-sectional view of a probe card in accordance with the second embodiment of the present invention.
Figure 6:
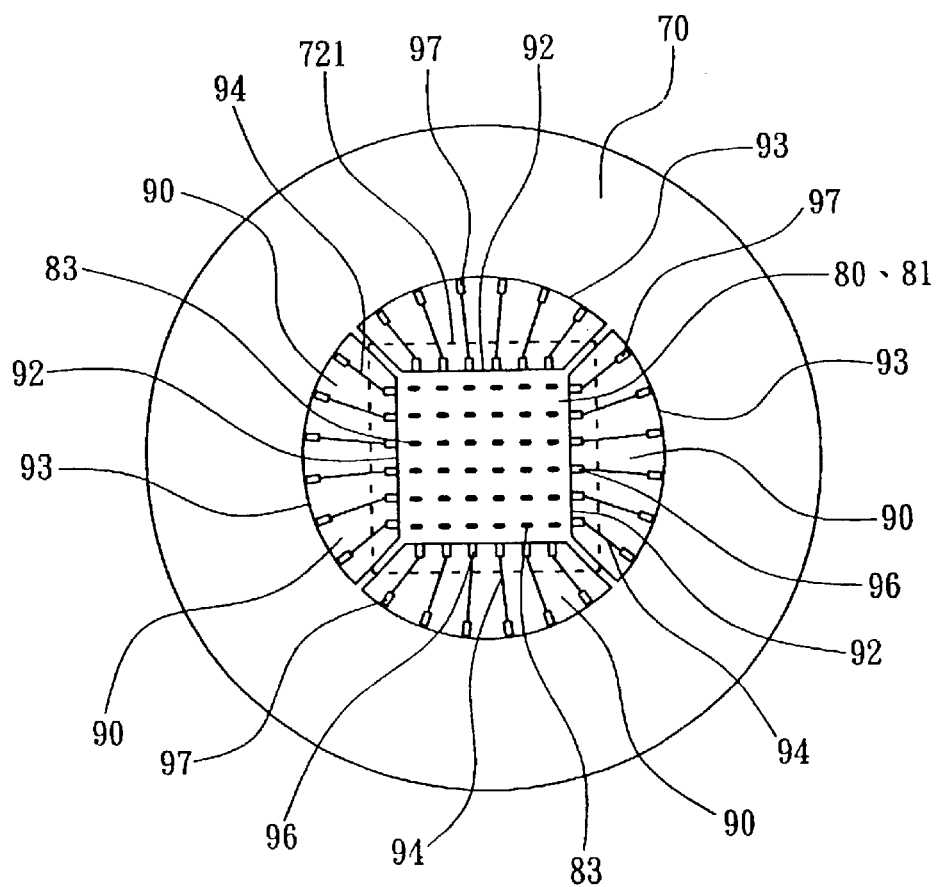
FIG. 6 is a bottom view of a probe card in accordance with the second embodiment of the present invention.
Figure 7:
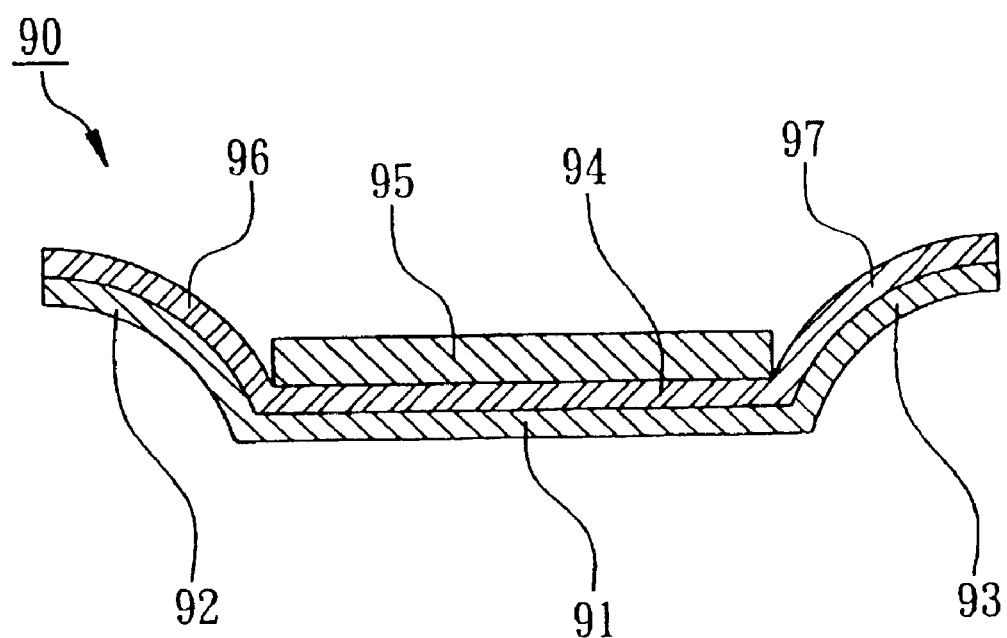
FIG. 7 is a cross-sectional view of an electrical connection device of the probe card in accordance with the second embodiment of the present invention.

The second embodiment in accordance with the present invention, as shown in FIG. 5 and 6, a modularized probe card comprises an interface board 70, a modularized probe head 80, and at least a compressible electrical connection device 90. The interface board 70 comprises an upholding backboard 71 and a printed circuit board 72. The printed circuit board 72 has an opening 721, which is larger then the probe head 80, and connecting ends 722 surrounding the edges of the opening 721, to form an interface board 70 with downsets. The upholding backboard 71 has through holes 711 corresponding in location to the opening 721 to combine the probe head 80 in the opening 721 of the printed circuit board 72. The probe head 80 comprises a silicon substrate, with a contact surface 81 forming with a plurality of needles 83 and contact pads 82 surrounding on the edges. It is preferable that a cushioning layer 84 is formed on the opposing surface to the contact surface 81, as shown in FIG. 6 and 7. The compressible electrical connection device 30 has a flexible insulation layer 91 and a plurality of circuits 94. The flexible insulation layer 91 has an inner end 92 facing toward the probe head 80 and an outer end 93 facing toward the interface board 70. The circuits 94 are covered by a cover layer 95, each circuit 94 has two ends connecting to the conductive finger 96 on the inner end 92 and the conductive finger 97 on the outer end 93. In this embodiment, the inner end 92 of the insulation layer 91, under the condition of without any external force, is elastically raised to support the corresponding conductive finger 96, and forms from the inner end 92 as an unity to connect to the support of the elastic contact member of the electrical connection device 90. This makes it possible for the conductive layer 96 to elastically touch and press the contact pads 82 of probe head 80. Besides, the outer end 93 also can be elastically raised or connected to a flexible printed circuit board. In this embodiment, the conductive fingers 97 of the outer end 93 are elastically touched and pressed the connecting ends 722 of the printed circuit board 72, therefore, it is applicable to utilize the compressible electrical connection device 90 to achieve the effect of modularized electrical connection by elastically touching and compressing the modularized probe head 80.

The above description of embodiments of this invention is intended to be illustrative and not limiting. Other embodiments of this invention will be obvious to those skilled in the art in view of the above disclosure.

What is claimed is:

1. A modularized probe card comprising:
   an interface board having a downset and a plurality of connecting ends surrounding the edges of the downset;
   a modularized probe head forming with a plurality of contacting pads on its edges, the probe head being replaceable and combining with the downset of the interface board; and
   at least a compressible electrical connection device for electrically connecting the interface board with the probe head, the compressible electrical connection device comprises:
      an insulation layer having a surface, an inner end and an outer end;
      a plurality of circuits forming on the surface of the insulation layer, with two ends of each circuits connecting respectively to the inner and outer ends; and
      a plurality of elastic contact members forming on the inner and outer ends, each having a supporter for combining with a conductive layer to provide compressible electrical connection of the contacting pads of probe head with the connecting ends of interface board.

2. The modularized probe card of claim 1, further comprising a mounting board electrically connecting with the interface board for combining with a test head of a test apparatus.

3. The modularized probe card of claim 2, further comprising a plurality of coaxial cables for combining the mounting board with the interface board.

4. The modularized probe card of claim 1, wherein the compressible electrical connection device has a cover layer covering the circuits.

5. The modularized probe card of claim 1, wherein the insulation layer is flexible.

6. The modularized probe card of claim 1, wherein the supporters are formed integratedly on the inner and outer ends of the insulation layer.

7. The modularized probe card of claim 1, wherein the interface board comprises an upholding backboard and a printed circuit board with an opening.

8. A modularized probe card for combining with a probe head of a test apparatus, comprising:
   an interface board having a downset and a plurality of connecting ends surrounding the edges of the downset;
   a probe head modularized installed on the downset of an interface board, with probe needles forming on one surface of probe head, and a plurality of contacting pads forming on its edges; and
   at least a compressible electrical connection device for electrically connecting the interface board with the probe head, the compressible electrical connection device comprising:
      an insulation layer with a surface;
      a plurality of circuits formed on the surface of the insulation layer, two ends of each circuit connecting respectively to a first contacting pad and a second contacting pad, wherein the first contacting pads are corresponding in location to the contact pads of the probe head, and the second contacting pads are corresponding in location to the connecting ends of the interface board; and
      a plurality of elastic contact members combining with the first contacting pad, each elastic contact member has a supporter combining with a conductive layer to provide electrical connection with the contact pads of the probe head.

9. The modularized probe card of claim 8, wherein the elastic contact member has a curved supporter for combining with the conductive layer.

10. The modularized probe card of claim 8, wherein the compressible electrical connection device has a cover layer covering the circuits.

11. The modularized probe card of claim 8, wherein the insulation layer is flexible.

12. The modularized probe card of claim 8, wherein each supporter has a base extending through the exterior of the corresponding combining first contacting pad.

13. The modularized probe card of claim 8, wherein each supporter has a vertical portion which is vertical to the corresponding combining first contacting pad.

14. The modularized probe card of claim 8, wherein at least two laterals of a support are cut equally to the corresponding combining first contacting pad.

15. The modularized probe card of claim 8, wherein two ends of each supports are extending through the exterior of the corresponding combining first contact pad.

16. The modularized probe card of claim 8, wherein each conductive layer has a horizontal extension for combining with the corresponding first contacting pad.

17. The modularized probe card of claim 8, wherein the interface board has at least a through hole connecting to the downset for fixing the probe head.

18. The modularized probe card of claim 8, wherein the probe head has a cushioning layer corresponding to the downset.

* * * * *

UNITED STATES PATENT AND TRADEMARK OFFICE
CERTIFICATE OF CORRECTION

PATENT NO. : 6,781,392 B1 Page 1 of 1
APPLICATION NO. : 10/435560
DATED : August 24, 2004
INVENTOR(S) : S.J. Cheng et al.

It is certified that error appears in the above-identified patent and that said Letters Patent is hereby corrected as shown below:

Title page, Item (73), the ASSIGNEES should read:

ChipMOS Technologies (Bermuda) Ltd., Hamilton (BM); ChipMOS Technologies, Inc.,

Hsinchu (TW)

Signed and Sealed this

Twenty-ninth Day of August, 2006

JON W. DUDAS
*Director of the United States Patent and Trademark Office*